(12) United States Patent
Sarusi et al.

(10) Patent No.: US 10,033,946 B2
(45) Date of Patent: Jul. 24, 2018

(54) SWIR TO VISIBLE IMAGE UP-CONVERSION INTEGRATED DEVICE

(71) Applicant: B. G. NEGEV TECHNOLOGIES AND APPLICATIONS LTD., AT BEN-GURION UNIVERSITY, Beer Sheva (IL)

(72) Inventors: Gabby Sarusi, Rishon LeZion (IL); Yuval Golan, Omer (IL)

(73) Assignee: B.G. Negev Technologies and Applications Ltd., at Ben-Gurion University, Beer Sheva (IL)

( * ) Notice: Subject to any disclaimer, the term of this patent is extended or adjusted under 35 U.S.C. 154(b) by 0 days.

(21) Appl. No.: 15/376,789

(22) Filed: Dec. 13, 2016

(65) Prior Publication Data

US 2017/0094199 A1    Mar. 30, 2017

Related U.S. Application Data

(63) Continuation-in-part of application No. PCT/IL2015/050556, filed on May 28, 2015.
(Continued)

(51) Int. Cl.
*H01L 25/00* (2006.01)
*H04N 5/33* (2006.01)
(Continued)

(52) U.S. Cl.
CPC ............... *H04N 5/332* (2013.01); *G01J 5/10* (2013.01); *H01L 27/3234* (2013.01); *G01J 2005/0077* (2013.01); *G01J 2005/106* (2013.01)

(58) Field of Classification Search
CPC ....... H04N 5/33; H01L 27/14649; G01J 5/20; G01J 2005/0077; G01J 5/08
See application file for complete search history.

(56) References Cited

U.S. PATENT DOCUMENTS

| 4,536,608 A * | 8/1985 | Sheng | H01L 31/02168 |
|---|---|---|---|
| | | | 136/259 |
| 2004/0036093 A1* | 2/2004 | Gordon | H01L 29/868 |
| | | | 257/222 |

(Continued)

FOREIGN PATENT DOCUMENTS

| WO | 2009/003150 A2 | 12/2008 |
|---|---|---|
| WO | 2012/037290 A2 | 3/2012 |

(Continued)

OTHER PUBLICATIONS

Chen "Hybrid Organic/Inorganic Optical Upconversion Devices", Doctor of Philosophy in Electrical and Computer Engineering, Waterloo, Ontario, Canada, 2011, p. 1-94.*

(Continued)

*Primary Examiner* — David Porta
*Assistant Examiner* — Mamadou Faye
(74) *Attorney, Agent, or Firm* — Roach Brown McCarthy & Gruber, P.C.; Kevin D. McCarthy

(57) ABSTRACT

Disclosed is a device for up-conversion of Short Wavelength Infra-Red (SWIR) images into visible images. The device comprises a sub micrometer thickness structure that is composed of several sub-layers, each having a typical thickness of tens to hundreds of nanometers. The device is composed of two main sections one on top of the other: (a) a highly efficient SWIR absorption thin layer and (b) a highly efficient organic light emitted diode (OLED). The generated visible image is emitted from the OLED through a top transparent cathode, which is deposited on the OLED.

9 Claims, 1 Drawing Sheet

Related U.S. Application Data

(60) Provisional application No. 62/012,430, filed on Jun. 16, 2014.

(51) Int. Cl.
*H01L 27/32* (2006.01)
*G01J 5/10* (2006.01)
*G01J 5/00* (2006.01)

(56) References Cited

U.S. PATENT DOCUMENTS

| | | | |
|---|---|---|---|
| 2007/0289623 A1* | 12/2007 | Atwater | B82Y 20/00 |
| | | | 136/252 |
| 2008/0011941 A1 | 1/2008 | Couture et al. | |
| 2009/0193704 A1 | 8/2009 | Pochapsky | |
| 2010/0065834 A1 | 3/2010 | Hammond | |
| 2010/0103508 A1 | 4/2010 | Pochapsky | |
| 2010/0177384 A1 | 7/2010 | Peroz et al. | |
| 2012/0057163 A1* | 3/2012 | Cheng | B82Y 15/00 |
| | | | 356/445 |
| 2012/0134618 A1 | 5/2012 | Carroll | |
| 2012/0212398 A1 | 8/2012 | Border et al. | |
| 2012/0223291 A1* | 9/2012 | Klem | B82Y 10/00 |
| | | | 257/21 |
| 2013/0334492 A1* | 12/2013 | Iguchi | H01L 31/035236 |
| | | | 257/13 |
| 2015/0008390 A1* | 1/2015 | Lewis | H01L 31/12 |
| | | | 257/13 |
| 2015/0280045 A1* | 10/2015 | Bensaoula | H01L 31/1075 |
| | | | 257/21 |

FOREIGN PATENT DOCUMENTS

| | | |
|---|---|---|
| WO | 2013/003850 A2 | 1/2013 |
| WO | 2013/028232 A1 | 2/2013 |
| WO | 2013/136167 A1 | 9/2013 |
| WO | 2015/193875 A1 | 12/2015 |

OTHER PUBLICATIONS

Sarasqueta Galileo, Processing and Characterization of Optoelectronic Devices based on INorganic Nonocrystals and Organic Semiconducters, PhD Diss, Univ of Floriday, Dec. 31, 2011 (176 pages).

Do Young, K.I.M., "Organic Photovoltaic Cells and Organic Up-convertion devices" PhD diss, Univ of Florida, Dec. 31, 2009 (3 pages).

Do Young, K.I.M., "Organic Photovoltaic Cells and Organic Up-convertion devices" PhD diss, Univ of Florida, Dec. 31, 2009 (173 pages).

International Search Report regarding PCT/IL2015/050556, dated Sep. 3, 2015 (13 pages).

Written Opinion of the International Searching Authority regarding PCT/IL2015/050556, dated Sep. 3, 2015 (5 pages).

Supplementary European Search Report for a counterpart foreign application—EP 15 80 9296; 9 pages, dated Jan. 26, 2018.

* cited by examiner

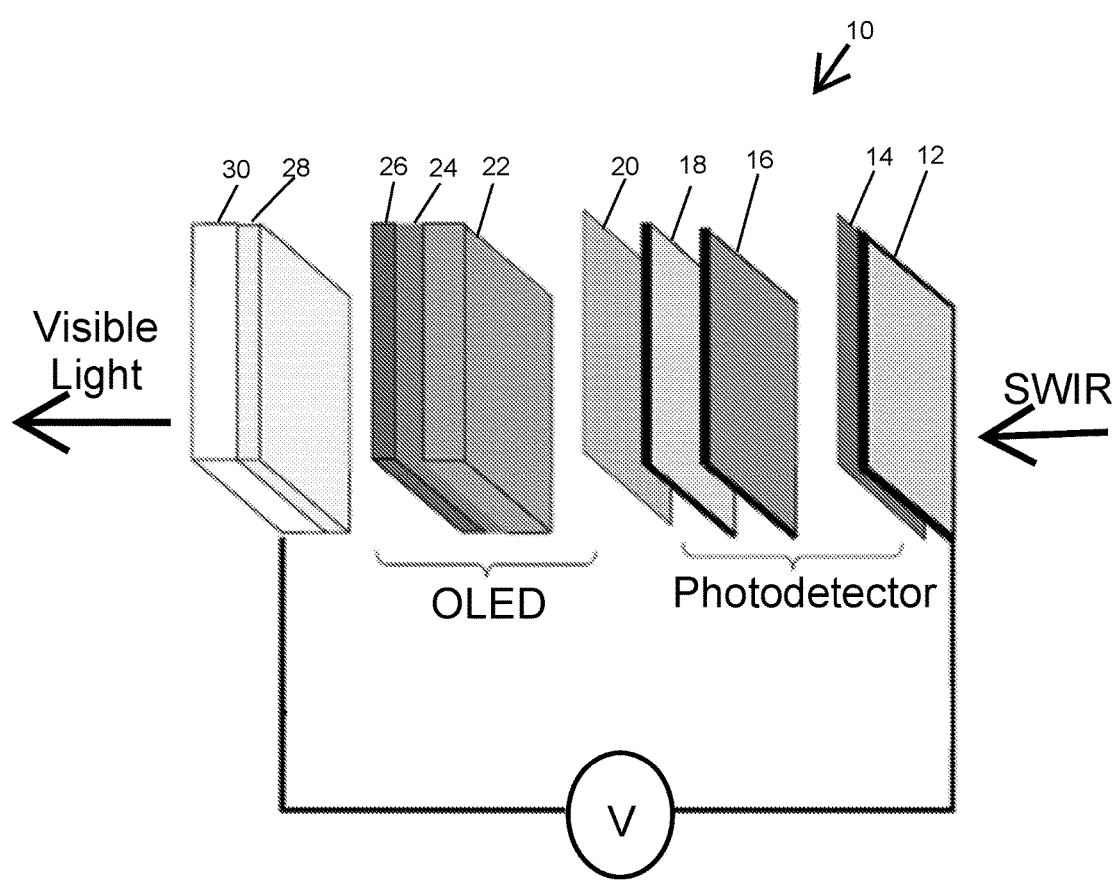

SWIR TO VISIBLE IMAGE UP-CONVERSION INTEGRATED DEVICE

FIELD OF THE INVENTION

The invention is from the field of photon up-conversion devices. Specifically the invention is from the field of up-conversion devices for converting images detected in short wavelength infrared light into images in the visible wavelength range.

BACKGROUND OF THE INVENTION

There is great interest in photon up-conversion devices in many fields. In particular in the field of devices capable of allowing humans to see images of scenes that are in nearly total darkness. Particularly important in this respect are devices that are capable of converting short wavelength infrared (SWIR—mainly between 1300 nm and 1800 nm in wavelength) images into visible ones.

The importance of the SWIR range of wavelengths is that the spectral irradiance of natural light sources such as nightglow known also as airglow is several times stronger in the SWIR mid-range than in the near infrared (NIR) range. Also the transparency through fog and dust is much higher in the SWIR range than in the visible or NIR. Thus scenes and objects that cannot be seen in visible light even in daylight can be viewed using SWIR natural light. In addition in this SWIR wavelength range the viewing device doesn't need cooling.

In general, present day night vision devices have several deficiencies including high cost, relatively large size and weight, and in some cases require cooling using liquid Nitrogen or Helium. In addition, other proposed up-conversion devices suffer from low quantum efficiency due to low SWIR photon absorption and Low efficiency of the conversion process.

It is a purpose of the present invention to provide a thin low-cost up-conversion integrated device for converting SWIR images into visible images.

Further purposes and advantages of this invention will appear as the description proceeds.

SUMMARY OF THE INVENTION

The invention is a device for up-conversion of Short Wavelength Infra-Red (SWIR) images into visible images. The device comprises a sub micrometer thickness structure that is composed of several sub-layers, each having a typical thickness of tens to hundreds of nanometers. The device is composed of two main sections one on top of the other located between a SWIR transparent anode at a first side of the device and a visible light transparent cathode at a second side of the device. The two main sections comprise:

A. a photodetector section comprising:
  i. a SWIR absorption sub-layer made of quantum confined nano-colloids or nano-columns; and
  ii. a double sided structured pixilated metal reflector sub-layer;
B. an organic light emitted diode (OLED) section comprising:
  i. a holes transport sub-layer;
  ii. an OLED sub-layer; and
  iii. an electron transport sub-layer.

The device comprises an external current source configured to create an electric field in the device that causes holes created by absorption of SWIR photons in the SWIR absorption layer to drift towards the visible light transparent cathode and electrons created by absorption of SWIR photons in the SWIR absorption layer to drift through the power source towards the SWIR transparent anode. The external current source is also adapted to inject electrons into the device at the cathode that can recombine with the holes to create a visible image in an OLED layer.

In embodiments of the device the photodetector section comprises a surface plasmon enhanced sub-layer located after the SWIR absorption sub-layer and interlaced with the structured pixilated metal sub-layer.

In embodiments of the device the thickness of the SWIR absorbing sub-layer is in the order of the charge carrier's diffusion length.

In embodiments of the device only the drifted holes maintain the spatial information of the image and visible photons are emitted at the same spatial location on one side of the device that the SWIR photons created the hole-electron pairs in the SWIR absorption sub-layer on the other side of the device.

In embodiments of the device the SWIR absorbing sub-layer is comprised of nano-columns that are grown perpendicular to a substrate.

In embodiments of the device the structured pixilated metal layer serves as a double sided mirror for the SWIR incident light and for the visible light emitted by the OLED on the other side.

In embodiments of the device metal nano-colloids or nano-columns having specific shapes and sizes to be tuned for SWIR wavelengths are immersed among the nano-columns in the SWIR absorption sub-layer, thereby creating localized plasmon enhanced absorption.

Embodiments of the device comprise objective optics before the anode and one of collimating optics or a focal plane array comprising sensors sensitive to visible light after the cathode.

All the above and other characteristics and advantages of the invention will be further understood through the following illustrative and non-limitative description of embodiments thereof, with reference to the appended drawing.

BRIEF DESCRIPTION OF THE DRAWINGS

FIG. 1 is a schematic drawing showing the structure of the device of the invention.

DETAILED DESCRIPTION OF EMBODIMENTS OF THE INVENTION

The invention is a thin device in the form of a sub micrometer thickness structure that is composed of several sub-layers, each having a typical thickness of tens to hundreds of nanometers. The device efficiently converts Short Wavelength Infra-Red (SWIR) images that are projected on one side of the device into visible images (e.g. green colored images) that are created on the other side of the device.

The wavelength up-conversion is done through a linear conversion and with relatively high conversion efficiency. An external electric field is induced to supplement the energy difference between the energy of the SWIR photons absorbed and the energy of the visible photons emitted.

The structure of the device of the invention is schematically shown in FIG. 1. The SWIR photons that create the image enter the device 10 via objective optics 12 through a SWIR transparent anode 14 made of a wide bandgap semiconductor that serves also as a SWIR window and a hole blocking layer. Transparent anode 14 can be made from, for example, ITO, GaAs, or Si, etc. The projected SWIR image is then absorbed by a high absorption coefficient semiconductor thin layer 16 located on the focal plane of the objective optics. The absorption layer 16, which is made from, for example PbS, PbSe, or PbSe/CdSe nano-columns or nano-colloids, has the correct bandgap tuned by the diameter of the quantum dots (nano-colloids) or quantum rods (nano-columns) due to the quantum confinement effect, from which it is created to create electron-hole pairs.

Absorbing layer 16 should be very thin to avoid lateral diffusion of the photo-excited charge carriers that may blur the visible image created on the other side of the device (OLED). Therefore the thickness of absorbing layer 16 is designed to be shorter than the charge carrier's diffusion length (or its carrier mean free path). Therefore, absorption should be increased via means that are different from increasing layer thickness.

One measure that can be introduced to increase the absorption of layer 16 is not to make the layer from bulk semiconductor material but to make it from nano-colloids (quantum dots) or nano-columns (quantum wires) especially of a material having large Bohr Radius and therefore high Oscillator-Strength in relatively large diameter for the SWIR photon absorption that is translated into a high absorption coefficient. On the other hand one of the main drawbacks of using nano-colloids (quantum dots) in the absorbing layer is their poor charge mobility between the nano-colloids. For this reason in this invention nano-columns (or nano rods) that are grown perpendicular to the substrate can be used. With the nano-columns, the oscillator strength parallel to the substrate is high due to the quantum confinement in these directions where along the z-direction (perpendicular to the substrate) the mobility remains equal to that of the high bulk mobility.

In measurements performed by the inventors, absorption of up to 90% of incident SWIR photons were observed in an absorbing layer 16 having a thickness of 300 nano-meters.

In order to further compensate for the low absorption due to the small thickness of the absorption layer 16, enhancement can be done using surface plasmon absorption techniques. The surface plasmon enhanced absorption takes place in layer 18, which is interlaced with a structured pixilated metal layer 20. Layer 20 is made for example from gold, aluminum, silver, etc. and with the proper structuring for SWIR serves as a surface plasmon absorption enhancer. Layer 18 is optional, however if the device does not comprise this layer, it must comprise a structured pixilated metal layer 20. The function of the structured pixilated metal layer 20 also is to serve as a double sided mirror for the SWIR incident light, reflecting any SWIR photons that are not absorbed in absorption layer 16 back towards absorption layer 16 where more of the SWIR photons are absorbed and, on its other side, reflecting the visible light emitted by the OLED towards the observer.

Another measure used in the present invention in order to increase the absorption of layer 16 is to immerse metal nano-particles having specific shape and size to be tuned for SWIR wavelengths among the nano-colloids or the nano-rods in absorbing layer 16. This creates localized plasmon enhanced absorption, i.e. localized oscillation fields due to excited collective electrons that increase the absorption cross section.

After SWIR light absorption, electron-hole pairs are generated in layer 16. The electrons are caused to drift by the external applied electric field towards the anode 12 and are injected through external current source V, which can be for example a 6-20 volt battery, to the other side of the device through a transparent cathode 28.

The holes drift through the device toward cathode 28, crossing the absorbing layer, the top pixilated metal reflector, and holes transport layer 22 and are recombined with the injected electrons, which drift from cathode 28 through electron transport layer 26, in an Organic Light Emitting Diode (OLED) layer 24 giving rise to and emission of visible photons. Since the device is very thin, lateral diffusion of the holes is negligible, thus the visible photon maintain the spatial position of the absorbed SWIR photon so the visible image should not be blurred.

In the architecture of the device of the invention only the drifted holes maintain the spatial information of the image and the visible emitted photons are emitted at the same spatial location on the collimating optics layer 30 that the SWIR photons created the hole-electron pairs on the absorption layer 16 on the other side of the device.

Since the visible photons are emitted with uniform illumination in $4\pi$ Strd, the metal reflector layer 20 that is located between the SWIR absorption layer 16 and the OLED layer 24, back reflects the visible light to $2\pi$ Strd. This visible light is collected by a collimating optics layer 30 that projects the image to the retina or to a CMOS or CCD visible camera. Since the visible image is seen via the cathode surface, it therefore should be transparent to visible light and yet serve as a good cathode, namely it must have a low work function and hence not create an electron blocking interface.

Alternatively, the transparent cathode 28 side of the device can be intimately attached to a CMOS or CCD focal plan array (FPA) (without the need of collimated optics) so the visible image emitted by the OLED is captured by the visible FPA and thus convert any visible FPA into a SWIR FPA that a SWIR camera can be built around it.

Although embodiments of the invention have been described by way of illustration, it will be understood that the invention may be carried out with many variations, modifications, and adaptations, without exceeding the scope of the claims.

The invention claimed is:

1. A device for up-conversion of Short Wavelength Infra-Red (SWIR) images into visible images, the device comprising a sub micrometer thickness structure that is composed of several sub-layers, each having a typical thickness of tens to hundreds of nanometers; wherein the device is composed of two main sections, an organic light emitted diode (OLED) section on top of a photodetector section, wherein the sub-layers comprise:
    A) a transparent anode layer that serves also as holes blocking layer;
    B) the photodetector section comprising:
        i) a SWIR absorption layer comprising nano-structures or nano-columns that are grown perpendicular to a substrate applied on top of the transparent anode layer;
        ii) a structured pixilated metal layer applied on top of the SWIR absorption layer to serve as dual sided mirror for the SWIR light from one side and to visible light on the other side; and
    C) the organic light emitted diode (OLED) section comprising:
        i) a holes transport layer applied on top of the pixelated metal layer;
        ii) an OLED layer applied on top of the holes transport layer;

iii) an electron transport layer applied on top of the OLED layer; and

D) a transparent cathode layer applied on top of the electron transport layer; and wherein, a SWIR image enters the device through the transparent anode layer and a visible image is emitted from the device through the top transparent cathode.

2. The device of claim 1, comprising an external current source configured to create an electric field in the device that causes holes created by absorption of SWIR photons in the SWIR absorption layer to drift through the device towards the visible light transparent cathode at the OLED section side of the device and electrons created by absorption of SWIR photons in the SWIR absorption layer to drift towards the SWIR transparent anode at the photodetector side of the device, the external current source also adapted to inject electrons into the device at the cathode that can recombine with the holes to create a visible image in the OLED layer and to supplement the energy difference between the SWIR absorbed photons and the visible photons that are emitted.

3. The device of claim 1, wherein the photodetector section comprises a surface plasmon enhanced sub-layer interlaced with the structured pixilated metal sub-layer located after the SWIR absorption sub-layer.

4. The device of claim 1, wherein the thickness of the SWIR absorbing sub-layer is shorter than the charge carrier's diffusion length.

5. The device of claim 1, wherein only the drifted holes maintain the spatial information of the image and visible photons are emitted at the same spatial location on one side of the device that the SWIR photons created the hole-electron pairs in the SWIR absorption sub-layer on the other side of the device.

6. The device of claim 1, wherein the structured pixilated metal layer serves as a surface plasmon enhancer and also as a double sided mirror for the SWIR incident light and for the visible light emitted by the OLED on the other side.

7. The device of claim 1, wherein metal nano-colloids or nano-columns having specific shapes and sizes to be tuned for SWIR wavelengths are immersed among the nano-columns in the SWIR absorption sub-layer, thereby creating localized plasmon enhanced absorption.

8. The device of claim 1 comprising objective optics before the anode and one of collimating optics or a focal plane array comprising sensors sensitive to visible light after the cathode.

9. The device according to claim 1, wherein the photodetector section and the organic light emitted diode (OLED) section are located between the transparent anode layer and the transparent cathode layer.

* * * * *